United States Patent [19]

Hartemann

[11] 4,110,653
[45] Aug. 29, 1978

[54] METHOD OF MODIFYING THE TEMPERATURE DRIFT OF THE PROPAGATION TIME OF SURFACE ELASTIC WAVES AND A DEVICE OBTAINED BY SAID METHOD

[75] Inventor: Pierre Hartemann, Paris, France

[73] Assignee: Thomson-CSF, Paris, France

[21] Appl. No.: 781,451

[22] Filed: Mar. 25, 1977

[30] Foreign Application Priority Data

Mar. 30, 1976 [FR] France ............................. 76 09210

[51] Int. Cl.² ........................................... H01L 41/10
[52] U.S. Cl. ................................ 310/313; 333/30 R; 250/492 A
[58] Field of Search ................. 310/313, 361; 333/72, 333/30 R; 250/492 A

[56] References Cited

U.S. PATENT DOCUMENTS

| 2,967,240 | 1/1961 | Koch | 310/361 X |
| 3,886,503 | 5/1975 | Bert et al. | 310/313 X |
| 3,886,529 | 5/1975 | Bert et al. | 333/30 R X |
| 4,016,412 | 4/1977 | Stern et al. | 310/313 X |

Primary Examiner—Mark O. Budd
Attorney, Agent, or Firm—Cushman, Darby & Cushman

[57] ABSTRACT

The present invention relates to the modification of the temperature-induced drift in propagation time of surface elastic waves. The invention proposes to achieve this modification by selecting a suitable crystal cut of the crystalline substrate, and carrying out a localized ion bombardment of the surface at which the elastic waves propagate.

7 Claims, 6 Drawing Figures

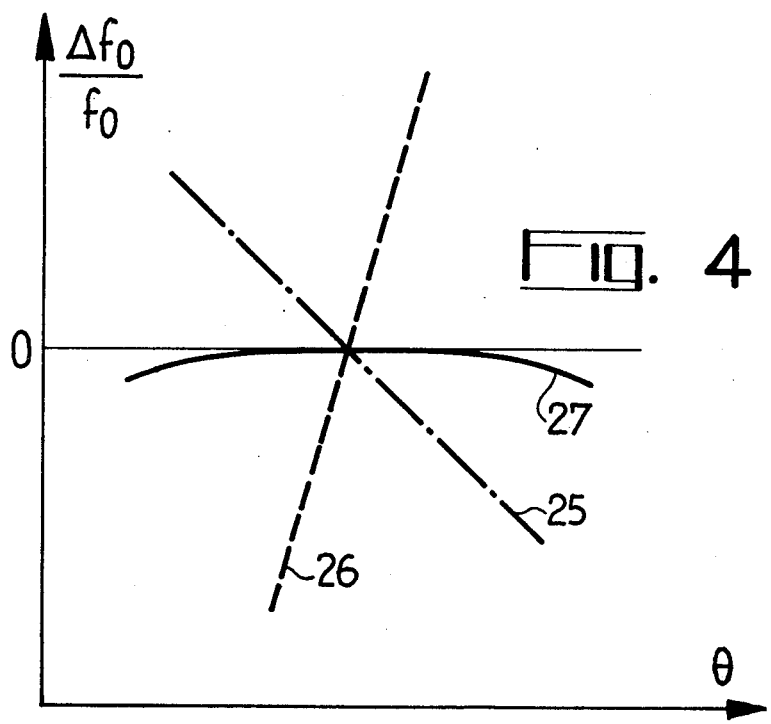
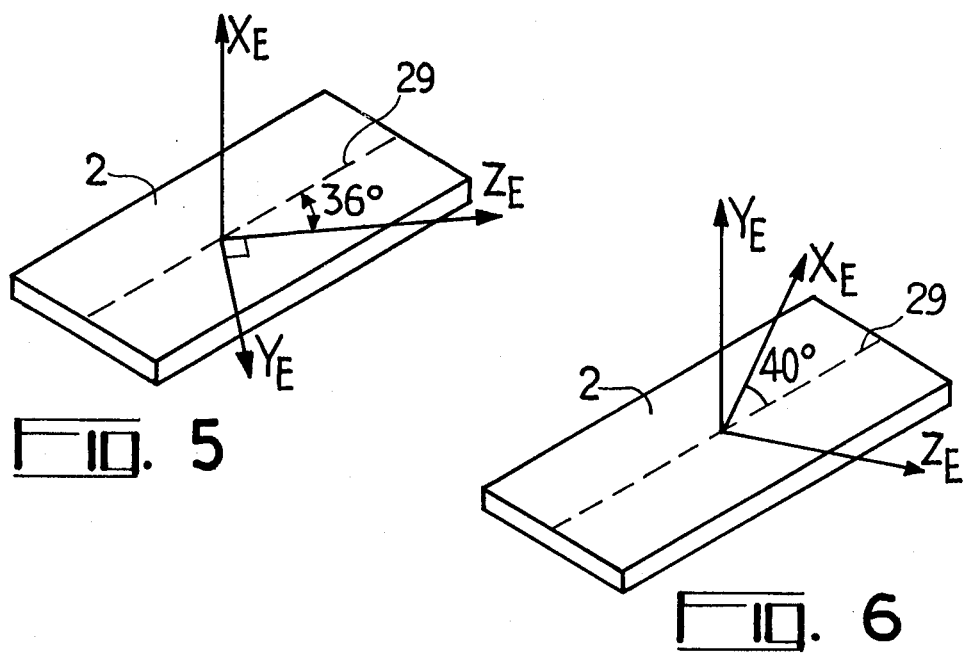

METHOD OF MODIFYING THE TEMPERATURE DRIFT OF THE PROPAGATION TIME OF SURFACE ELASTIC WAVES AND A DEVICE OBTAINED BY SAID METHOD

The present invention relates to surface elastic wave devices of the kind generally comprising a crystalline piezoelectric substrate at the surface of which electromechanical elements are provided in order to bring about an exchange of vibrational energy; the vibrations which are excited are normal or not to said surface, and they attenuate rapidly with increasing distance from said surface.

By way of non-limitative example, the electromechanical elements in question may be constituted by interdigitated comb transducers and by networks of filaments which do duty as couplers or reflectors; the surface elastic waves may be Rayleigh waves. One important application of surface elastic wave devices is encountered in the field of the generation and filtering of electrical signals.

In this context, it is important that any frequency determined in relation to the surface elastic wave device, should have a value which is as far as possible independent of temperature. In order to achieve this aim, it is well known to cut a crystalline substrate in accordance with a particular cleavage plane. By means of an appropriate choice of the direction of propagation of the surface waves, frequency-stable operation within a given temperature range is ensured. However, it is found in practice that this operating temperature range is not well situated in relation to ambient temperature. In other words, in order to achieve high frequency stability, it is necessary to arrange the surface elastic wave device within a thermostatically controlled enclosure. Since this enclosure operates through heat exchanges with a hot source and a cold source, the fact that the operating temperature range is located at ambient temperature, constitutes a drawback. It is well known that temperature control is not effective and easy to achieve unless it is performed at a temperature which differs substantially from ambient temperature.

In order to overcome the drawback referred to earlier, the invention provides for certain zones of the surface of a crystalline substrate to be subjected to an ion bombardment the effect of which is to disturb the regular lattice arrangement of the atoms and consequently the dependent physical characteristics.

Experience shows that by submitting a crystalline substrate to the action of a charged particle bombardment, the law representing the variation in propagation time of the surface elastic waves as a function of temperature is wholly different from that observed in the situation where the regular lattice arrangement of the atoms has undergone no alteration. By subjecting a zone of the surface of the substrate through which the surface elastic waves pass, to ion bombardment, it is possible to substantially reduce the influence of temperature upon the value of propagation time or to contrive that the smaller variations occur within a temperature range which is more suited to simple and accurate thermostatic control.

In accordance with the present invention, there is provided a method of reducing the differences in propagation time of surface elastic waves ascribed to variations in temperature of a crystalline substrate, propagating said surface elastic waves, said method comprising: the steps of cutting the crystalline substrate in accordance with a predetermined crystal cut, and subjecting at least one superficial zone of the substrate, located in the trajectory of said waves, to an ion bombardent; the intensity and extent of said ion bombardment being adjusted for substantially reducing within given temperature and frequency ranges, said differences in propagation time.

The invention likewise relates to the surface elastic wave device obtained by the aforementioned method.

For a better understanding of the present invention and to show how the same may be carried into effect, reference will be made to the ensuing description and the attached figures among which:

FIG. 4 is likewise an explanatory diagram.

FIGS. 5 and 6 describe quartz crystal cuts which can be used as variant embodiments.

Figure 1:
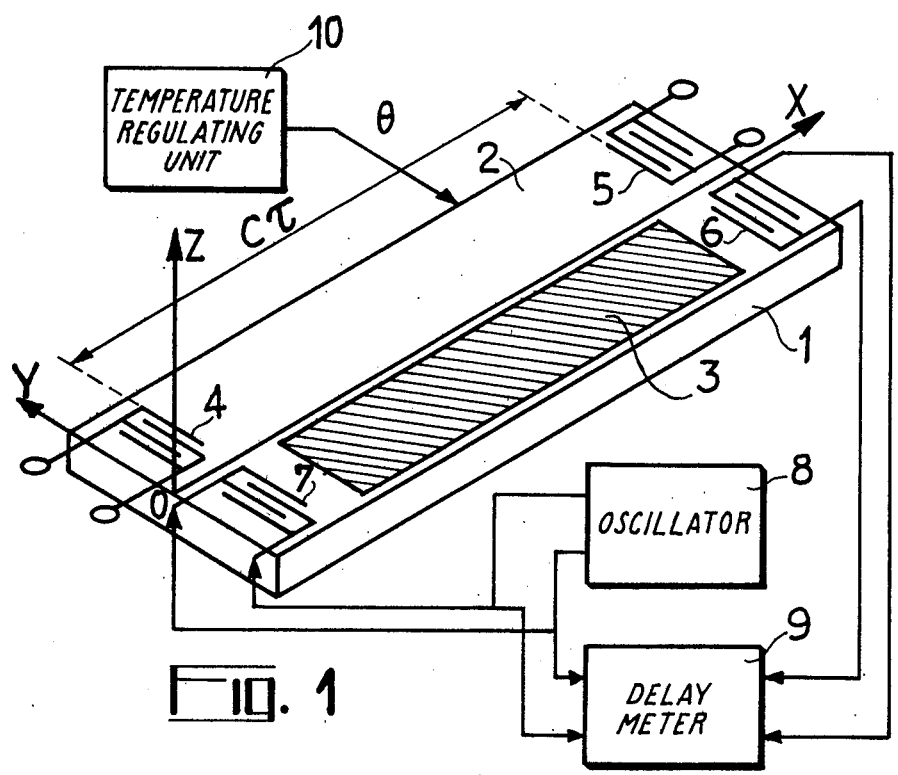
FIG. 1 illustrates a circuit which makes it possible to assess the delay time $\tau$ differences as a function of the temperature $\theta$.

FIG. 1, shows a substrate 1 cut from a crystalline piezoelectric material. By way of non-limitative example, the substrate will be assumed to be cut from quartz and its surface 2 will constitute a known kind of cut such as the ST cut. The system defined by the axes XYZ shown in FIG. 1, is orientated in such a manner that the axis X corresponds to the direction of propagation of the surface elastic waves, this axis coinciding in the case of the ST cut, with the electrical axis $X_E$ of the quartz crystal. The axis Z is arranged perpendicularly to the face 2 of the substrate 1 and the axis Y is contained in said face. In the case of an ST cut, the axes Y and Z do not coincide with the electrical axes $Y_E$ and $Z_E$ of the quartz crystal.

The cut shown in FIG. 1 is therefore conventionally known as an (ST, X)—cut. FIG. 1 illustrates four transducers constituted by interleaved comb electrodes 4, 5, 6 and 7. The combs 4 and 5 form a first delay device and are separated by an interval C $\tau$, where $\tau$ is the delay time and C the phase velocity of the surface elastic waves propagating in the direction X along the face 2. The comb structures 6 and 7 form a second delay device to which the process in accordance with the invention has been applied. In this instance the process consists of ion bombardment of the face 2 over an area 3 which is cross-hatched in FIG. 1.

By way of example, in order to form the area 3 the device shown in FIG. 1 has been arranged in an ion implantation apparatus. Helium ions $He^+$ have been accelerated there under the effect of a potential difference of 100 k e V and the bombardment time has been adjusted so that the dose received by the face 2 is equal to $1.5 \cdot 10^{16}$ $He^+/cm^2$. In the example under consideration, the implanted zone extends over 20 mm and the centre-to-centre interval separating the transducers 6 and 7 is of the order of 24. 34 mm. In order to be able to make ready comparisons, the transducers 4 and 5 are designed in the same fashion as those 6 and 7. In addition to the surface wave device, FIG. 1 symbolically illustrates the system 10 for regulating and measuring the temperature $\theta$ of the substrate 1, a sinusoidal electrical signal generator calibrated in terms of frequency $f$ and a delay-measuring device 9 which can be constituted advantageously by a phasemeter.

The circuit of FIG. 1 is designed to show the delay $\tau$ produced by the surface elastic wave device as well as the delay shift $\Delta\tau$ which the delay $\tau$ experiences when the temperatures varies from $\theta$ to $\Delta\theta$. Since the surface elastic wave device is called upon to operate in a circuit which is characterised by an oscillatory or reference frequency $f$, measurements of time or in other words duration are advantageously translated into terms of frequency shifts. It is a straightforward matter to show that in an oscillator circuit, where $f_o$ is the frequency of oscillation at the temperature $\theta$ and $\Delta f_o$ is the frequency shift observed at the temperature $\theta + \Delta\theta$, the relationship:

$$\Delta\tau/\tau = \Delta f_o/f_o$$

applies. The diagram of FIG. 3 has been based upon the circuit of FIG. 1; it relates to measurements carried out upon a (ST, X)—cut quartz substrate. For ease of illustration the ordinates plot the relative frequency shift $\Delta f_o/f_o$ but the scale adopted takes as its zero on the ordinates the peak value of the curve 17 which in the case of the (ST,X)—cut quartz crystal is at the temperature $\theta = 20°$ C. The graph 17 has been plotted at the frequency $f_o = 235$ MHz using the circuit of FIG. 1, the oscillator 8 being connected to the comb 4 and the right-hand input of the phasemeter 9 to the comb 5. The area between the combs 4 and 5 has not experienced any ion bombardment so that the frequency drift characteristic 17 is observed. The optimum operating range is illustrated by the outline 22 in which it will be observed that the influence of temperature is least marked.

Figure 3:
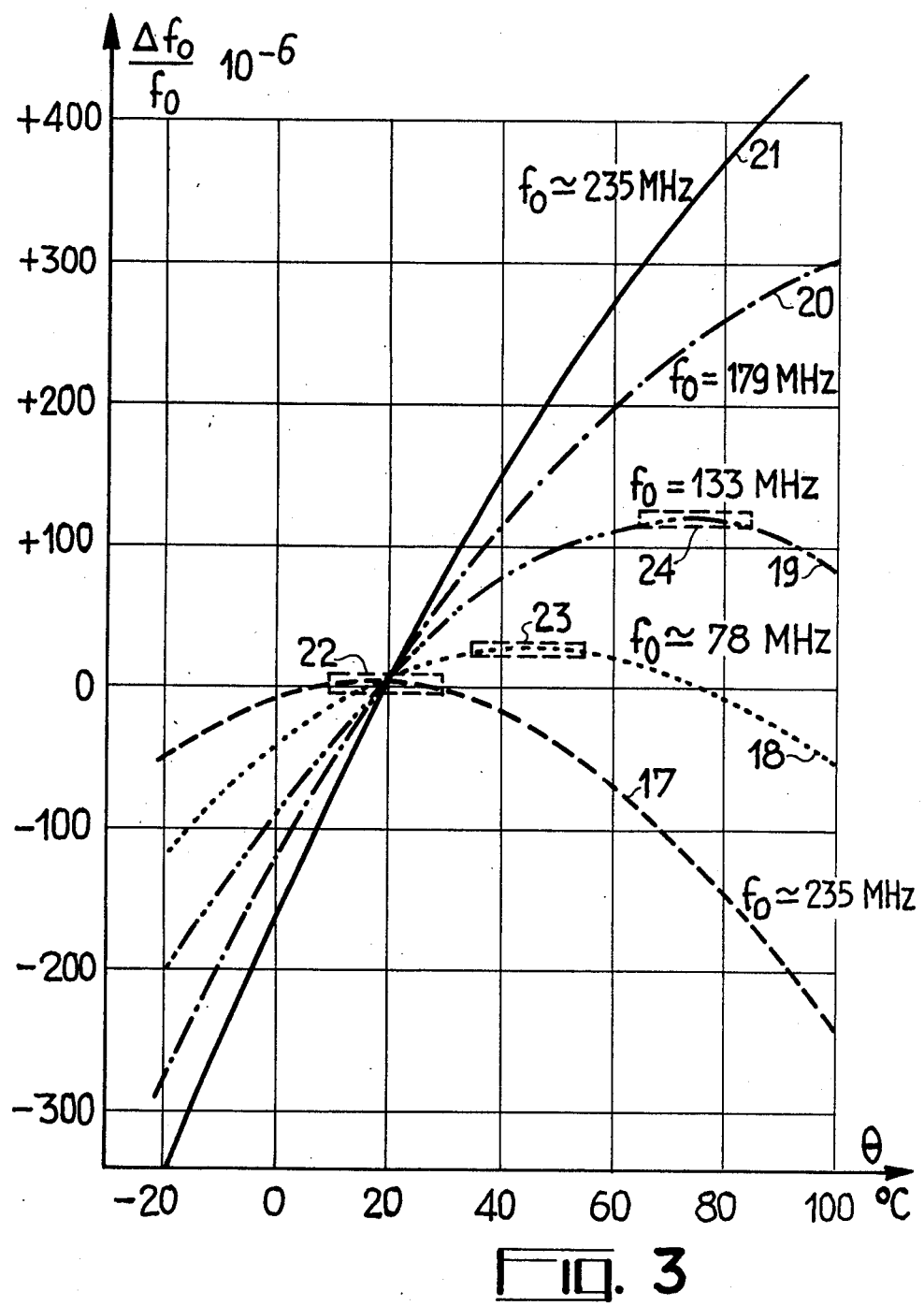
FIG. 3 is an explanatory diagram.

The other graphs 18, 19, 20 and 21 on the diagram of FIG. 3 have been obtained at different measurement frequencies using the circuit of FIG. 1. We are again concerned with an (ST,X)—cut quartz crystal which, however, has had $1.5 \cdot 10^{16}$ He$^+$/cm$^2$ ion implantation carried out upon it at a potential difference of 100 k e V. The graph 18 plotted at the frequency 78 MHz, shows that due to the ion implantation in the zone 3, the optimum operating range of the device is located within the outline 23 which corresponds to an increase in the operating temperature. At a measurement frequency 133 MHz, the graph 19 is obtained and the outline 24 is shifted still further towards higher operating temperatures.

A comparative study of the graphs of the diagram shown in FIG. 3 tells us that the processing of the surface of the crystalline substrate by ion implantation substantially modifies the frequency drift curve. This change is the more marked the higher the operating frequency. This is explained by the fact that the depth of penetration of the vibrational energy reduces with rising frequency so that the influence of the superficial modification of the physical properties of the substrate by implantation, becomes more marked at high frequencies. The shape of the graph 21 plotted at 235 MHz shows that the temperature-induced frequency drift is positive in the implanted zone. A study of the thermal drift in the case of an amorphous quartz substrate shows a marked positive drift as far as the ratio $\Delta f_o/f_o$ is concerned. It is therefore reasonable to assume that the ion bombardment of a crystalline substrate has the effect of producing dislocations in the regular lattice arrangement of the atoms, causing the bombarded zone of the crystalline material to tend towards the amorphous state. The destructive effect produced by the ion bombardment is generally partial only and account must also be taken of the interstitial inclusion of foreign atoms. This explains why the bombarded zone can be likened to an amorphous zone.

Finally, it will be realised that the invention provides a method which consists of choosing an appropriately cut crystalline material and subjecting it, in a selected zone situated in the trajectory of the surface waves, to ion bombardment. One of the advantages of using this kind of method can be comprehended from a consideration of FIG. 2 which illustrates a surface elastic wave device 2, 6, 7 equipped with an implanted zone 3. In order to produce oscillations at a stable frequency $f$, the surface elastic wave device is associated with an amplifier 10 and the whole arrangement located in a thermostatically controlled enclosure 11 equipped with a temperature sensor 13 and an element 16 which is capable of supplying heat quantities or of picking off such quantities selectively in time. The element 16 may be constituted by a heating resistor or a Peltier junction. An electrical power source 15 and a thermostatically controlled contact breaker 14 controlled by the sensor 13, make it possible to maintain a substantially constant temperature $\theta$ within the enclosure 11. In order for temperature control to be effective and easily realised, the controlled value $\theta$ should differ substantially from the ambient temperature $\theta_A$. If we consider FIG. 3, then we will see that in the absence of the implanted zone 3, the drift follows the curve 17 and the temperature at the centre of the area 22 is around 20° C. Control of this temperature, which is neither low nor high in relation to ambient temperature, cannot be satisfactorily effected. By contrast, by providing an implanted zone 3 and by choosing the oscillatory frequency at $f_o = 133$ MHz, it will be seen, considering the curve 19 of FIG. 3, that the controlled temperature can be raised to 75° C. This choice is much more favourable and has been rendered possible by the use of ion implantation in the substrate.

The invention is of course not limited to the (ST, X)—cut quartz crystal discussed thus far. In other words, the shift in the peak of the drift characteristic towards higher temperatures can also be produced in the opposite sense. Other crystalline materials can be used, for example lithium tantalate, and also other cuts.

In a more general way, ion implantation furnishes the means of compensating the frequency drift.

In FIG. 4, another frequency drift diagram has been shown. The drift graph shown in chain dotted line 25 relates to a non-implanted quartz substrate cut in accordance with a cleavage plane of the kind shown in FIGS. 5 or 6. This drift curve 25 differs from that of FIG. 3 by the fact that its slope is negative; the slope is of opposite sign to the slope of the drift curve 26 which relates to the amorphous crystal. By means of ion implantation it is possible to compensate to a very large extent for the frequency drifts which occur as a consequence of the temperature variations. In this fashion, a drift curve of the kind shown by 27 is obtained, with an extended range of optimum operation in which the first order coefficient is zero.

The cuts responsible for the compensation shown in FIG. 4 have been shown in FIGS. 5 and 6. FIG. 5 illustrates a substrate whose top face 2 is cut in accordance with the (X, Z 36°) cleavage plane; the electrical axes of the quartz crystal are $X_E$, $Y_E$, $Z_E$ and the direction of propagation of the surface elastic waves has been marked 29. In FIG. 6, the cut is (Y, X 40°).

Figure 2:
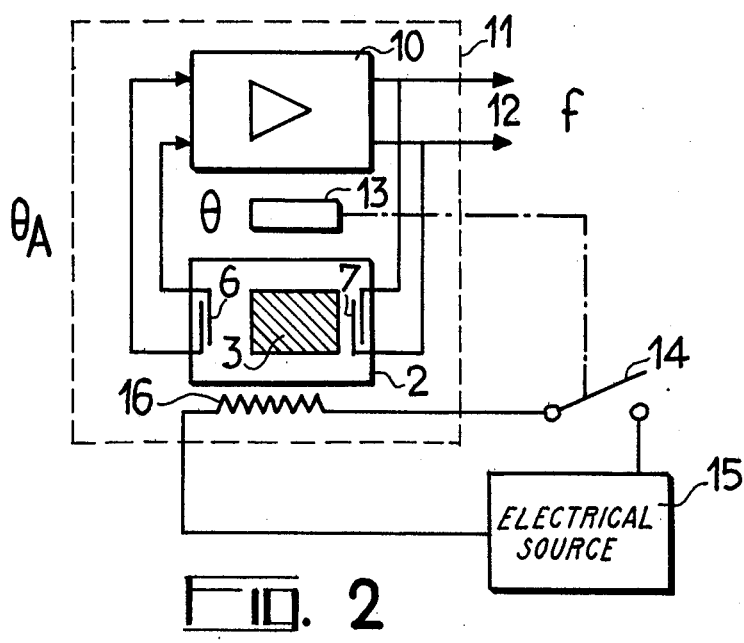
FIG. 2 illustrates a surface elastic wave device operating as an oscillator within a thermostatically controlled enclosure.

As far as the positioning of the implanted layer is concerned, there are two possible arrangements which are worthy of note. For one, as shown in FIG. 2, the implanted zone 3 may be interposed in such a manner as to intercept the surface elastic waves over the whole width of the vibrational energy beam emitted by the transducer 7. For another, the zone may be arranged only over part of the width of the substrate. To this end, reference may be made to FIG. 1 which illustrates an implanted zone which occupies only half the width of the substrate, assuming that the transducers 4 and 7 and those 5 and 6 operate in parallel.

What I claim is:

1. A method of reducing the differences in propagation time of surface elastic waves ascribed to variations in temperature of a crystalline substrate propagating said surface elastic waves, said method comprising the steps of cutting the crystalline substrate in accordance with a predetermined crystal cut, and in subjecting at least one superficial zone of the substrate, located in the trajectory of said waves, to an ion bombardment; said ion bombardment permanently altering the regular lattice arrangement of the atoms of said crystalline substrate; the intensity and the extent of said ion bombardment being adjusted for substantially reducing within given temperature and frequency ranges, said differences in propagation time.

2. A method as claimed in claim 1, wherein said temperature range comprises an operating temperature to either side of which said differences have the same sign; said ion bombardment producing a shift in said operating temperature.

3. A method as claimed in claim 1, wherein said ion bombardment produces over the extent of said zone an inversion of the sign of the thermal drift inherent to the crystalline substrate having said crystal cut.

4. A method as claimed in claim 2, wherein said crystalline substrate is quartz; said cut being an (ST, X)—cut; said shift consisting in an increase in said temperature.

5. A method as claimed in claim 2, wherein said crystalline substrate is made of quartz; said cut being an (X, Z 36°)—cut.

6. A method as claimed in claim 2, wherein said crystalline substrate is made of quartz; said cut being an (Y, X, 40°) cut.

7. An electromechanical surface wave device comprising a crystalline substrate; a superficial zone of the surface of said substrate being modified by an ion bombardment permanently altering the regular lattice arrangement of the atoms of said crystalline substrate; said zone being located on the path of said surface wave for causing a modification of the thermal drift of the propagation time of said surface wave along said surface.

* * * * *